(12) United States Patent
Ye

(10) Patent No.: US 11,051,093 B2
(45) Date of Patent: Jun. 29, 2021

(54) MICROPHONE STRUCTURE WITH IMPROVED SUBSTRATE

(71) Applicants: ZILLTEK TECHNOLOGY (SHANGHAI) CORP., Shanghai (CN); ZILLTEK TECHNOLOGY CORP., Taiwan (CN)

(72) Inventor: Jinghua Ye, Shanghai (CN)

(*) Notice: Subject to any disclaimer, the term of this patent is extended or adjusted under 35 U.S.C. 154(b) by 0 days.

(21) Appl. No.: 16/897,123

(22) Filed: Jun. 9, 2020

(65) Prior Publication Data

US 2021/0136474 A1 May 6, 2021

(30) Foreign Application Priority Data

Nov. 1, 2019 (CN) .......................... 201911061252.4

(51) Int. Cl.
| | |
|---|---|
| H04R 1/08 | (2006.01) |
| H04R 9/08 | (2006.01) |
| H04R 11/04 | (2006.01) |
| H04R 17/02 | (2006.01) |
| H04R 1/04 | (2006.01) |

(52) U.S. Cl.
CPC ...................................... H04R 1/04 (2013.01)

(58) Field of Classification Search
CPC . H04R 1/08; H04R 9/08; H04R 11/04; H04R 17/02; H04R 21/02
USPC .................................................. 381/355, 365
See application file for complete search history.

(56) References Cited

U.S. PATENT DOCUMENTS

| | | | | |
|---|---|---|---|---|
| 8,170,259 | B2 * | 5/2012 | Liu ........................... | H04R 1/02 381/365 |
| 8,520,878 | B2 * | 8/2013 | Inoda ...................... | H04R 1/021 381/361 |
| 8,565,465 | B2 * | 10/2013 | Inoda ....................... | H04R 1/38 381/361 |
| 8,913,756 | B2 * | 12/2014 | Chang ................... | H01R 13/665 381/91 |
| 8,958,592 | B2 * | 2/2015 | Huang ..................... | H04R 1/08 381/351 |
| 2004/0146171 | A1 * | 7/2004 | Ito .......................... | H04R 1/083 381/355 |

* cited by examiner

*Primary Examiner* — Suhan Ni
(74) *Attorney, Agent, or Firm* — Clement Cheng

(57) ABSTRACT

The invention discloses a microphone structure with an improved substrate, comprising: a L-shaped substrate having an L-shaped normal cross section; an encapsulation shell, wherein the encapsulation shell and the L-shaped substrate form an acoustic cavity; the acoustic cavity is provided with: an acoustic transducer; an ASIC (Application Specific Integrated Circuit) chip, electrically connected to the acoustic transducer; and an acoustic through-hole disposed on the L-shaped substrate or the encapsulation shell. The present invention has the beneficial effects that, an L-shaped ceramic substrate is provided, a plurality of bonding pads are arranged on a vertical surface of the L-shaped substrate, so that electronic devices may be welded to the vertical surface of the L-shaped substrate, so that the problem of an excessive large area of the substrate being occupied by the electronic devices due to the presence of an excessive number of the electronic devices on the substrate may be avoided.

5 Claims, 7 Drawing Sheets

MICROPHONE STRUCTURE WITH IMPROVED SUBSTRATE

CROSS-REFERENCE TO RELATED APPLICATIONS

The present application claims priority to and the benefit of Chinese Patent Application No. CN 201911061252.4 filed on Nov. 1, 2019, the entire content of which is incorporated herein by reference.

BACKGROUND OF THE INVENTION

1. Field of the Invention

The invention relates to the field of electronic devices, and more particularly, to a microphone structure with an improved substrate.

2. Description of the Related Art

A microphone, colloquially mic or mike, is an energy conversion device that converts sound signals into electrical signals. In the twentieth century, the microphone started to convert from the sound energy into electricity through inductance or capacitance instead of resistance. A lot of newly developed microphones are available in the market, such as aluminum ribbon microphones, moving coil microphones, and the currently widely used capacitor microphones and electrets microphones.

A MEMS microphone, based on CMOSMEMS, has a smaller volume. The consistency of the MEMS microphone is 4 times better than that of an electrets capacitor microphone, so the MEMS microphone is particularly suitable for use in an array of cost-effective microphones. A better-matched microphone may improve the forming of sound wave and reduce noise.

In the prior art, the substrate of the MEMS microphone is a Printed Circuit Board (PCB), and a bonding pad is arranged at a bottom surface of the PCB. It is low in cost and simple in manufacturing, and intensive production is adopted. However, such a structure has the disadvantage that integration is limited, so that it is impossible to meet the requirement of the client that the length or width should be as small as possible.

SUMMARY OF THE INVENTION

An object of the invention is to provide a microphone structure with an improved substrate for solving the above-mentioned technical problems.

The technical solution is as follows:

a microphone structure with an improved substrate, comprising:

an L-shaped substrate having an L-shaped normal cross section;

an encapsulation shell, wherein the encapsulation shell and the L-shaped substrate form an acoustic cavity; the acoustic cavity is provided with:

an acoustic transducer;

an ASIC (Application Specific Integrated Circuit) chip, electrically connected to the acoustic transducer; and an acoustic through-hole disposed on the L-shaped substrate or the encapsulation shell.

Preferably, the L-shaped substrate is an integrally molded ceramic substrate.

Preferably, the L-shaped substrate comprises a first substrate and a second substrate vertically connected to the first substrate, a length of the second substrate is less than that of the first substrate, and the first substrate or the second substrate is provided with a plurality of bonding pads.

Preferably, the acoustic transducer and the ASIC chip are disposed on the first substrate, the acoustic through-hole is disposed at a mounting position for the acoustic transducer on the first substrate, and the plurality of bonding pads are arranged on an outer surface of the first substrate.

Preferably, the acoustic transducer is disposed on the first substrate, and the ASIC chip is disposed on the second substrate.

Preferably, the ASIC chip is disposed on the first substrate, the acoustic transducer is disposed on the second substrate, the acoustic through-hole is disposed at a mounting position for the acoustic transducer on the second substrate, and the plurality of bonding pads are arranged on an outer surface of the second substrate.

Preferably, the acoustic through-hole is disposed on a top surface or a side surface of the encapsulation shell.

Preferably, the encapsulation shell is a metal shell.

Preferably, the encapsulation shell has an L-shaped cross section, and forms, together with the L-shaped substrate, the acoustic cavity.

By adopting the above-mentioned technical solutions, the present invention has the following beneficial effects: an L-shaped ceramic substrate is provided, a plurality of bonding pads are arranged on a vertical surface of the L-shaped substrate, so that electronic devices may be welded to the vertical surface of the L-shaped substrate, so that the problem of an excessive large area of the substrate being occupied by the electronic devices due to the presence of an excessive number of the electronic devices on the substrate may be avoided. The space in the vertical surface and a horizontal surface of the microphone is maximally utilized, so that the height or width of the microphone is reduced, the size of the microphone is reduced, and the microphone is highly integrated; the L-shaped ceramic substrate is resistant to high temperature, avoiding damage to highly integrated electronic devices upon exposure to high temperature, the service life of the microphone is increased; the ASIC (Application Specific Integrated Circuit) chip and the acoustic transducer are flexible in installation; and the acoustic through-hole may also be formed at different position, so that it is suitable for use in various devices.

BRIEF DESCRIPTION OF THE DRAWINGS

The accompanying drawings, together with the specification, illustrate exemplary embodiments of the present disclosure, and, together with the description, serve to explain the principles of the present invention.

Figure 1:
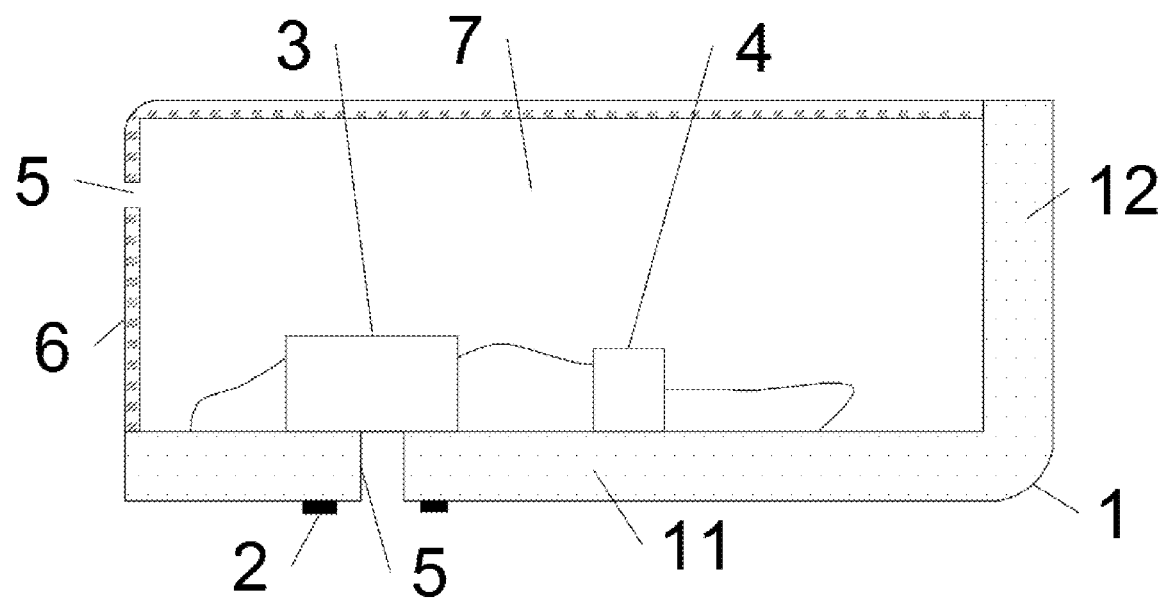
FIG. 1 is a cross-sectional view of a microphone according to a first embodiment of the present invention.

In the accompanying drawings: 1 L-shaped substrate; 2 bonding pad; 3 acoustic transducer; 4 ASIC chip; 5 acoustic through-hole; 6 encapsulation shell; 7 acoustic cavity; 11 first substrate; 12 second substrate.

DETAILED DESCRIPTION

The present invention will now be described more fully hereinafter with reference to the accompanying drawings, in which exemplary embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like reference numerals refer to like elements throughout.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," or "includes" and/or "including" or "has" and/or "having" when used herein, specify the presence of stated features, regions, integers, steps, operations, elements, and/or components, but do not preclude the presence or addition of one or more other features, regions, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

As used herein, "around", "about" or "approximately" shall generally mean within 20 percent, preferably within 10 percent, and more preferably within 5 percent of a given value or range. Numerical quantities given herein are approximate, meaning that the term "around", "about" or "approximately" can be inferred if not expressly stated.

As used herein, the term "plurality" means a number greater than one.

Hereinafter, certain exemplary embodiments according to the present disclosure will be described with reference to the accompanying drawings.

Example 1

Figure 2:
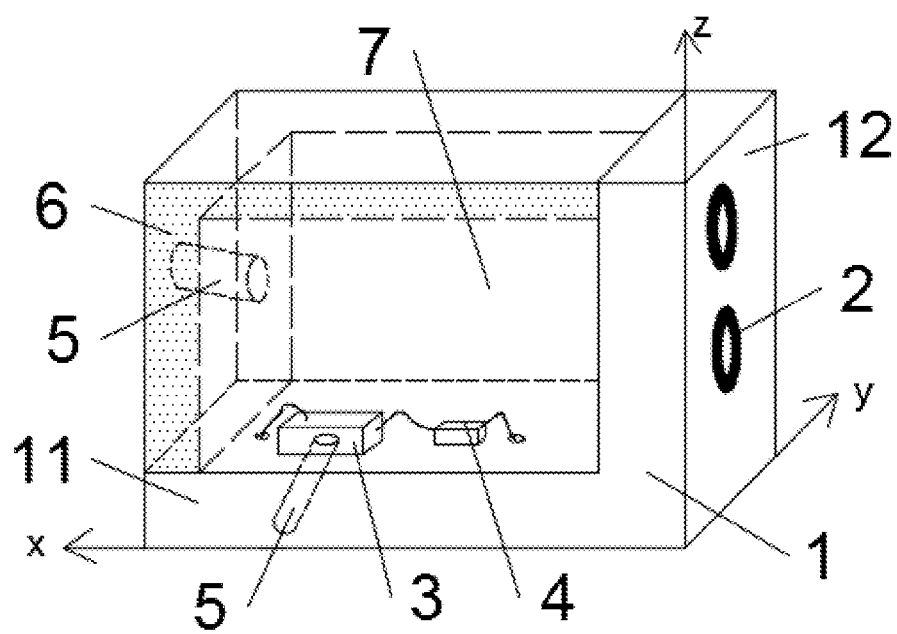
FIG. 2 is a perspective illustrative view of a microphone according to a first embodiment of the present invention.

As shown in FIGS. 1 and 2, the invention provides a microphone structure with an improved substrate, comprising:

an L-shaped substrate 1 having an L-shaped normal cross section;

an encapsulation shell 6, wherein the encapsulation shell 6 and the L-shaped substrate 1 form an acoustic cavity 7; the acoustic cavity 7 is provided with:

an acoustic transducer 3;

an ASIC (Application Specific Integrated Circuit) chip 4, electrically connected to the acoustic transducer 3; and an acoustic through-hole 5 disposed on the L-shaped substrate 1 or the encapsulation shell 6.

The invention has the advantages that in the present invention, an L-shaped ceramic substrate is provided, a plurality of bonding pads are arranged on a vertical surface of the L-shaped substrate, so that electronic devices may be welded to the vertical surface of the L-shaped substrate, so that the problem of an excessive large area of the substrate being occupied by the electronic devices due to the presence of an excessive number of the electronic devices on the substrate may be avoided. The space in the vertical surface and a horizontal surface of the microphone is maximally utilized, so that the height or width of the microphone is reduced, the size of the microphone is reduced, and the microphone is highly integrated.

As a preferred embodiment of the present invention, the L-shaped substrate 1 is an integrally molded ceramic substrate. The ceramic substrate is resistant to high temperature, avoiding damage to highly integrated electronic devices upon exposure to high temperature, so that the service life of the microphone is increased.

As a preferred embodiment of the present invention, the encapsulation shell 6 is a metal shell.

The encapsulation shell 6 has an L-shaped normal cross section. A bottom end of a side part, which has a shorter length, of the encapsulation shell 6 is fixedly connected to the top of one end of the first substrate 11; one end of a side part, which has a longer length, of the encapsulation shell 6 is fixedly connected to a top end of an inner side of the second substrate 12. In such a way, the volume of the microphone is saved; a compact connection is achieved; a gap is smaller, and the sealing performance is improved.

As a preferred embodiment of the present invention, the L-shaped substrate 1 comprises a first substrate 11 and a second substrate 12 vertically connected to the first substrate 11, a length of the second substrate 12 is less than that of the first substrate 11, and the first substrate 11 or the second substrate 12 is provided with a plurality of bonding pads 2.

As a preferred embodiment of the present invention, the acoustic transducer 3 and the ASIC chip 4 are disposed on the first substrate 11, the acoustic through-hole 5 is disposed at a mounting position for the acoustic transducer 3 on the first substrate 11, and the plurality of bonding pads 2 are arranged on an outer surface of the first substrate 11. The bonding pads 2 are electrically connected to the external device and transmit signals inside the microphone to the outside of the microphone.

For conventional microphones, some electronic devices are directly welded to a flat plate substrate. If a great number of electronic devices are involved, the substrate is required to have an area large enough for the accommodation of the electronic devices. Preferably, as shown in FIG. 2, the L-shaped substrate 1 is provided in the present invention; the acoustic transducer 3 and ASIC chip 4 are installed on the first substrate 11; a capacitor, a resistor, and some necessary circuit chips for the microphone are installed on the vertical surface of the second substrate 12 (or, the acoustic transducer 3 is installed on the second substrate 12, and other electronic devices are installed on the first substrate 11). In this way, the horizontal space and the vertical space of the L-shaped substrate 1 is effectively used. Also, a combination of planar installation and three-dimensional installation is used instead of the planar installation, so that the length of the L-shaped substrate 1 is reduced, and the occupied area of the substrate is greatly reduced. In addition, the L-shaped substrate 1 is produced by integral molding process. It is easy to manufacture and is compact in structure. In this case, the overall volume of the microphone is reduced as much as possible along an x-axis or y-axis direction in FIG. 2, thereby reducing the length or width of the substrate, and thus reducing the area of the substrate.

As a preferred embodiment of the present invention, an acoustic through-hole 5 may be (or may not be) formed in the encapsulation shell 6. The acoustic through-hole 5 is used to receive the voice of a user outside of the microphone, to enable a silicon diaphragm in the acoustic transducer 3 to vibrate. Then the acoustic transducer 3 converts the voltage variation, generated from the vibration of the silicon diaphragm, into an electrical signal and transmits the electrical signal to the ASIC chip 4 of the microphone. The electrical signal is transformed into a transmissible and receivable signal, and the transmissible and receivable signal is output to a receiving end, such as a loudspeaker.

Preferably, an acoustic through-hole is provided on a side of the encapsulation shell 6, and the acoustic through-hole 5 is in communication with the acoustic cavity 7. The acoustic through-hole may be installed at a vertical angle of the device, so that two adjacent sides of the device have the acoustic through-holes. Advantageously, when any one side of the device is covered (for example, when a flip-type device is closed), another acoustic through-hole can still receive sound. The arrangement of these two acoustic through-holes 5 allows sound to enter the microphone in a variety of ways, thereby increasing the fault tolerance of the microphone. That is to say, when any one of the acoustic through-holes 5 is broken or blocked, sound may still enter the microphone from the other acoustic through-hole 5 which remains intact. Thus, it is suitable for use in more devices.

Figure 3:
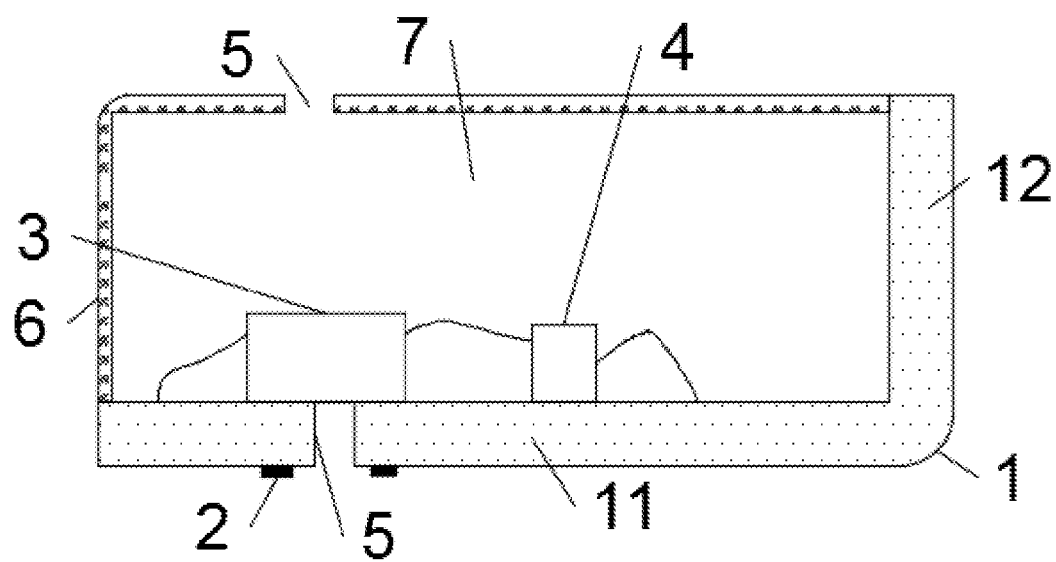
FIG. 3 is a schematic view showing an arrangement of another acoustic through-hole of the microphone according to a first embodiment of the present invention.

Furthermore, as shown in FIG. 3, the acoustic through-holes 5 may be disposed on a top surface of the encapsulation shell 6. In this case, air enters the two acoustic through-holes 5 from two opposite directions. After the microphone is installed in the device, the two acoustic through-holes 5 are located on two opposite faces of the device. As a result, when the microphone is arranged at the center of the front of the flip-type device, the concern for the microphone failing to receive sound after the flip-type device closes its cover can be eliminated (since the acoustic through-hole 5 in the back of the device can readily receive sound).

The microphone is provided with two acoustic through-holes 5, one of which is provided on the L-shaped substrate, and the other is provided on the encapsulation shell 6. The example for only one acoustic through-hole is listed as follows.

Figure 4:
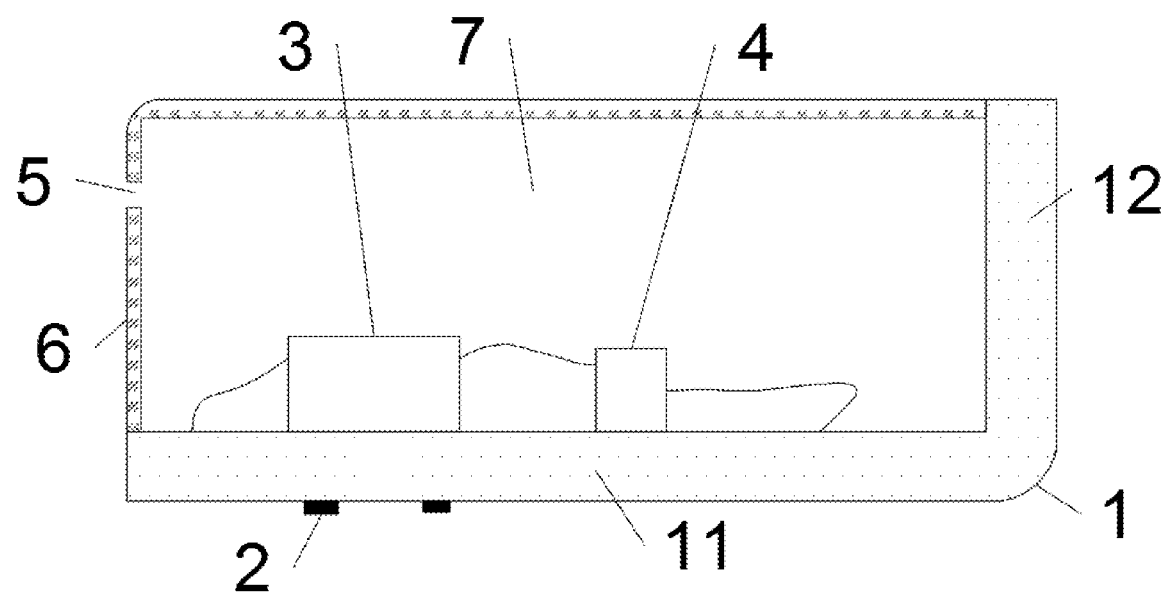
FIG. 4 is a schematic view of a microphone having only one acoustic through-hole according to a first embodiment of the present invention.

As shown in FIG. 4, in this invention, provision of only one acoustic through-hole is contemplated. For example, only one acoustic through-hole 5 is provided on the encapsulation shell 6.

Figure 5:
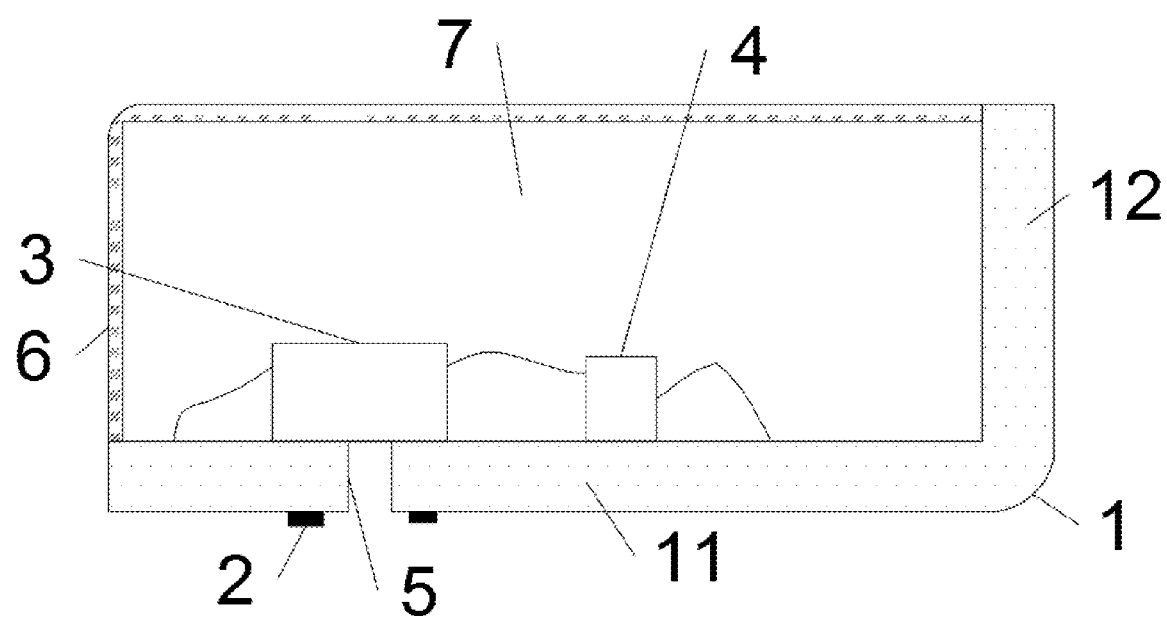
FIG. 5 is another schematic view of a microphone having only one acoustic through-hole according to a first embodiment of the present invention.

As shown in FIG. 5, the microphone is provided with only one acoustic through-hole 5. The acoustic through-hole 5 of the microphone may also be disposed on the L-shaped substrate 1, and the mounting position of the acoustic through-hole 5 corresponds to the mounting position of the acoustic transducer 3.

Example 2

Figure 6:
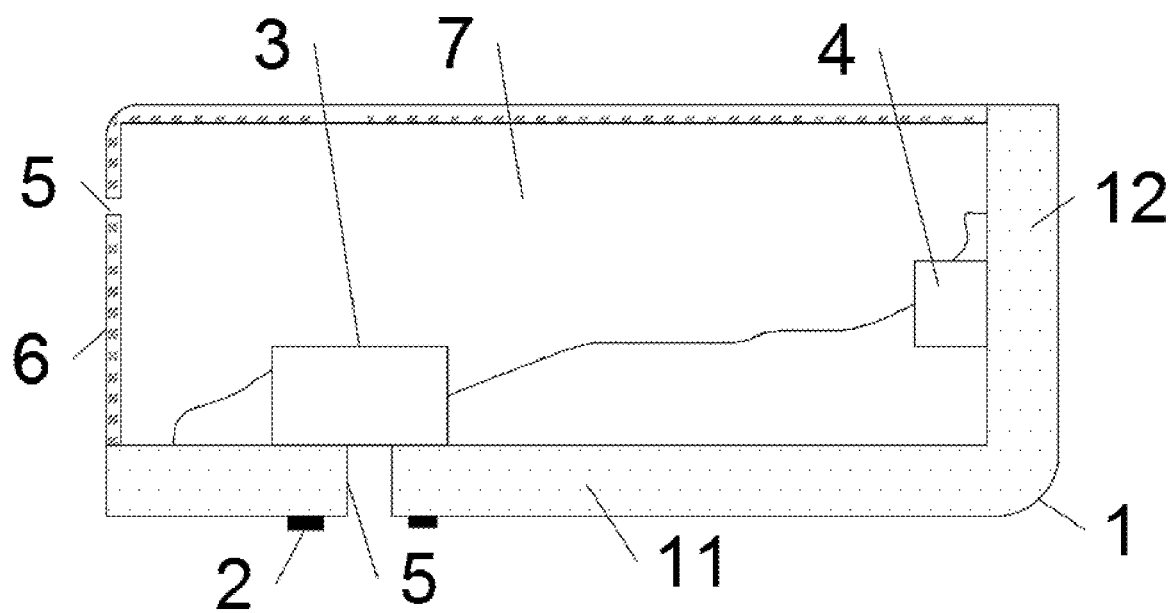
FIG. 6 is an inside cross-sectional view of a microphone according to a second embodiment of the present invention.

As shown in FIG. 6, the acoustic transducer 3 is disposed on the first substrate 11, and the ASIC chip 4 is disposed on the second substrate 12.

This example differs from the example 1 in the following ways:

The ASIC chip 4 arranged on the first substrate 11 is disposed on an outer surface of the second substrate 12, and other components remain the same. It has the advantages that a mounting surface for the acoustic transducer 3 may be separated from a mounting surface for the ASIC chip 4, so that other relay electronic devices, such as resistors, and signal processors, can be installed between the acoustic transducer 3 and the ASIC chip 4. Also, since the distance between the acoustic transducer 3 and the ASIC chip 4 is increased, heat transfer cannot be well achieved; so they do not interfere with each other, thus an efficient sound transmission is achieved.

Example 3

Figure 7:
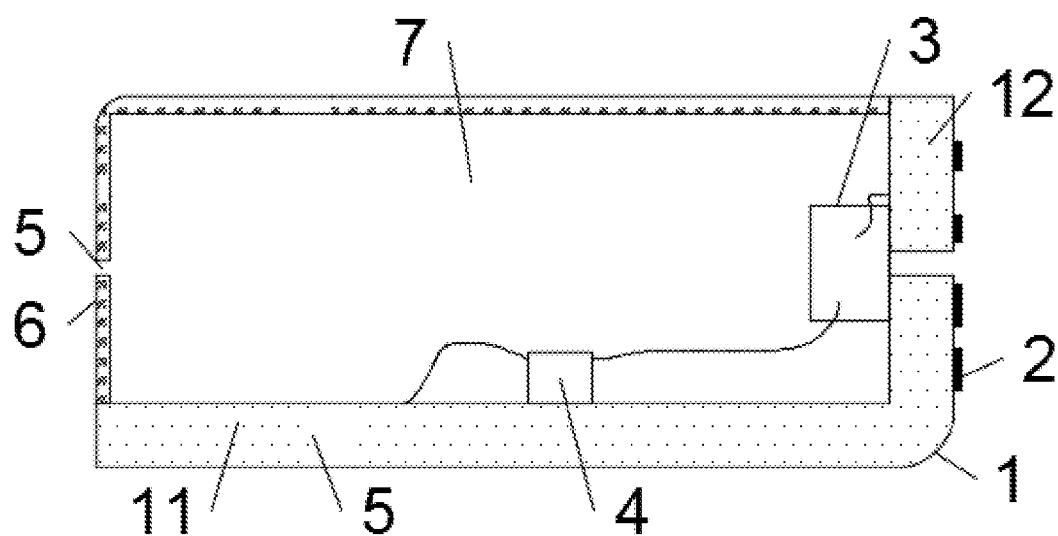
FIG. 7 is an inside cross-sectional view of a microphone according to a third embodiment of the present invention.

As shown in FIG. 7, the ASIC chip 4 is disposed on the first substrate 11, the acoustic transducer 3 is disposed on the second substrate 12, the acoustic through-hole 5 is disposed at a mounting position for the acoustic transducer 3 on the second substrate 12, and the plurality of bonding pads 2 are arranged on an outer surface of the second substrate 12.

This example differs from the example 1 in the following ways:

The acoustic transducer 3 previously arranged on the first substrate 11 is disposed on the second substrate 12. The acoustic through-hole 5 arranged on the first substrate 11 is disposed in a mounting position for the acoustic transducer 3 on the second substrate 12, so that the sound transmission efficiency of the microphone is improved. The plurality of bonding pads 2 are arranged on the outer surface of the second substrate 12 for an easy connection between the microphone and the external device.

In conclusion, it can be known from the above-mentioned three examples that the mounting positions for the ASIC chip 4, the acoustic transducer 3, and the plurality of bonding pads 2 may be varied. Microphones with particular functions may be customized according to the properties of the device. In addition, the number and the mounting position of the acoustic through-hole 5 are not limited, and they can be adjusted according to the air tightness and air ventilation of the device, so that the microphone may be suitable for use in most of audio equipments.

The above descriptions are only the preferred embodiments of the invention, not thus limiting the embodiments and scope of the invention. Those skilled in the art should be able to realize that the schemes obtained from the content of specification and drawings of the invention are within the scope of the invention.

What is claimed is:

1. A microphone structure with an improved substrate, comprising:
   an L-shaped substrate having an L-shaped normal cross section;
   an encapsulation shell, wherein the encapsulation shell and the L-shaped substrate form an acoustic cavity; the acoustic cavity is provided with:
   an acoustic transducer;
   an ASIC (Application Specific Integrated Circuit) chip, electrically connected to the acoustic transducer; and
   an acoustic through-hole disposed on the L-shaped substrate or the encapsulation shell;
   the L-shaped substrate comprises a first substrate and a second substrate vertically connect to the first substrate, a length of the second substrate is less than that of the first substrate, and the first substrate or the second substrate is provided with a plurality of bonding pads; wherein, the acoustic transducer and the ASIC chip are disposed on the first substrate, the acoustic through-hole is disposed at a mounting position for the acoustic transducer on the first substrate, and the plurality of bonding pads are arranged on an outer surface of the first substrate;

or, the acoustic transducer is disposed on the first substrate, and the ASIC chip is disposed on the second substrate;

or, the ASIC chip is disposed on the first substrate, the acoustic transducer is disposed on the second substrate, the acoustic through-hole is disposed at a mounting position for the acoustic transducer on the second substrate, and the plurality of bonding pads are arranged on an outer surface of the second substrate.

2. The microphone structure with an improved substrate of claim 1, wherein the L-shaped substrate is an integrally molded ceramic substrate.

3. The microphone structure with an improved substrate of claim 1, wherein the acoustic through-hole is disposed on a top surface or a side surface of the encapsulation shell.

4. The microphone structure with an improved substrate of claim 1, wherein the encapsulation shell is a metal shell.

5. The microphone structure with an improved substrate of claim 1, wherein the encapsulation shell has an L-shaped cross section, and forms, together with the L-shaped substrate, the acoustic cavity.

\* \* \* \* \*